US012772810B2

(12) United States Patent
Sandhu et al.

(10) Patent No.: US 12,772,810 B2
(45) Date of Patent: Oct. 20, 2026

(54) METHODS OF FORMING MATERIAL WITHIN OPENINGS EXTENDING INTO A SEMICONDUCTOR CONSTRUCTION, AND SEMICONDUCTOR CONSTRUCTIONS HAVING FLUOROCARBON MATERIAL

(71) Applicant: Micron Technology, Inc., Boise, ID (US)

(72) Inventors: Gurtej S. Sandhu, Boise, ID (US); Sony Varghese, Manchester-by-the-Sea, MA (US); John A. Smythe, Boise, ID (US); Hyun Sik Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 18/663,364

(22) Filed: May 14, 2024

(65) Prior Publication Data

US 2024/0297068 A1 Sep. 5, 2024

Related U.S. Application Data

(62) Division of application No. 17/224,003, filed on Apr. 6, 2021, now Pat. No. 12,020,979, which is a division (Continued)

(51) Int. Cl.

*H10P 90/00* (2026.01)
*B29C 41/08* (2006.01)

(Continued)

(52) U.S. Cl.

CPC .......... *H10P 90/1906* (2026.01); *B29C 41/08* (2013.01); *H10P 14/22* (2026.01);

(Continued)

(58) Field of Classification Search

CPC ......... H01L 21/76232; H01L 21/76224; H01L 21/76229; H01L 21/7624; H01L 21/76837;

(Continued)

(56) References Cited

U.S. PATENT DOCUMENTS 5,224,265 A * 7/1993 Dux ........................ H05K 3/462 29/846
5,553,538 A * 9/1996 Freitag ................ B41F 15/0818 101/486

(Continued)

FOREIGN PATENT DOCUMENTS

| | | |
|---|---|---|
| CN | 101312149 | 11/2008 |
| CN | 102760686 | 10/2012 |

(Continued)

*Primary Examiner* — Michael P Wieczorek
(74) *Attorney, Agent, or Firm* — Wells St. John P.S.

(57) ABSTRACT

Some embodiments include a construction having a horizontally-extending layer of fluorocarbon material over a semiconductor construction. Some embodiments include methods of filling openings that extend into a semiconductor construction. The methods may include, for example, printing the material into the openings or pressing the material into the openings. The construction may be treated so that surfaces within the openings adhere the material provided within the openings while surfaces external of the openings do not adhere the material. In some embodiments, the surfaces external of the openings are treated to reduce adhesion of the material.

9 Claims, 14 Drawing Sheets

Related U.S. Application Data of application No. 15/650,194, filed on Jul. 14, 2017, now Pat. No. 10,998,221.

(51) Int. Cl.

| | |
|---|---|
| ***B29K 83/00*** | (2006.01) |
| ***H10P 14/22*** | (2026.01) |
| ***H10P 14/46*** | (2026.01) |
| ***H10P 14/60*** | (2026.01) |
| ***H10P 14/61*** | (2026.01) |
| ***H10W 10/00*** | (2026.01) |
| ***H10W 10/10*** | (2026.01) |
| ***H10W 10/17*** | (2026.01) |
| ***H10W 20/00*** | (2026.01) |
| *B29C 35/08* | (2006.01) |
| *B32B 3/26* | (2006.01) |
| *H10P 72/00* | (2026.01) |

(52) U.S. Cl.

CPC .......... *H10P 14/46* (2026.01); *H10P 14/6326* (2026.01); *H10P 14/6346* (2026.01); *H10P 14/6686* (2026.01); *H10P 14/6689* (2026.01); *H10W 10/0145* (2026.01); *H10W 10/17* (2026.01); *H10W 10/181* (2026.01); *H10W 20/056* (2026.01); *H10W 20/098* (2026.01); *B29C 2035/0827* (2013.01); *B29K 2083/00* (2013.01); *B32B 3/266* (2013.01); *H10P 14/61* (2026.01); *H10P 72/0448* (2026.01)

(58) Field of Classification Search

CPC ....... H01L 21/76877; H01L 21/768989; H01L 21/0226; B41F 15/0818; C23C 24/00

See application file for complete search history.

(56) References Cited

U.S. PATENT DOCUMENTS

| | | | | |
|---|---|---|---|---|
| 6,150,252 | A | 11/2000 | Hsu et al. | |
| 6,475,285 | B2 | 11/2002 | Ikegami et al. | |
| 6,592,943 | B2 * | 7/2003 | Chan | H05K 3/462 427/98.5 |
| 6,856,023 | B2 * | 2/2005 | Muta | H01L 21/76898 257/E21.597 |
| 8,420,541 | B2 | 4/2013 | Shih et al. | |
| 2002/0131669 | A1 | 9/2002 | Onoe | |
| 2003/0070569 | A1 | 4/2003 | Bulthaup | |
| 2007/0184654 | A1 | 8/2007 | Akram et al. | |
| 2007/0275540 | A1 * | 11/2007 | Hackitt | H01L 21/76898 438/460 |
| 2009/0083977 | A1 * | 4/2009 | Hanke | H01L 21/76898 29/852 |
| 2010/0173470 | A1 | 7/2010 | Lee et al. | |
| 2012/0034379 | A1 * | 2/2012 | Wang | B41M 1/12 427/248.1 |
| 2013/0089987 | A1 | 4/2013 | Gouk et al. | |
| 2013/0270703 | A1 * | 10/2013 | Zierath | H01L 21/76831 438/653 |
| 2014/0093646 | A1 | 4/2014 | Uyama | |
| 2015/0197455 | A1 | 7/2015 | Pranov | |

FOREIGN PATENT DOCUMENTS

| | | |
|---|---|---|
| SG | 145087 | 9/2008 |
| SG | 169329 | 3/2011 |
| WO | WO 2007/092176 | 8/2007 |

* cited by examiner

METHODS OF FORMING MATERIAL WITHIN OPENINGS EXTENDING INTO A SEMICONDUCTOR CONSTRUCTION, AND SEMICONDUCTOR CONSTRUCTIONS HAVING FLUOROCARBON MATERIAL

TECHNICAL FIELD

Methods of forming material within openings extending into a semiconductor construction, and semiconductor constructions having fluorocarbon material.

BACKGROUND

Conventional processes may include fabrication sequences having one or more steps in which multiple openings associated with a semiconductor construction are to be filled with insulative material. However, fluid dynamics and other parameters may lead to under-fill within some openings (the under-fill may be particularly problematic relative to larger openings if there is a distribution of openings of different sizes), and excess material (overburden) across regions of the semiconductor construction between openings, and/or across smaller openings if there is a distribution of openings of different sizes.

It would be desirable to develop new methods for filling multiple openings with insulative material. It would also be desirable if such new methods could be extended for utilization with other materials besides insulative materials; such as, for example, conductive materials, etc.

DETAILED DESCRIPTION OF THE ILLUSTRATED EMBODIMENTS

Some embodiments include methods of forming material within numerous openings having different sizes relative to one another. The methods may be generally applicable for filling openings with any desired material; and in some embodiments the methods may be utilized to fill the openings with insulative material, conductive material, etc.

Figure 1A:
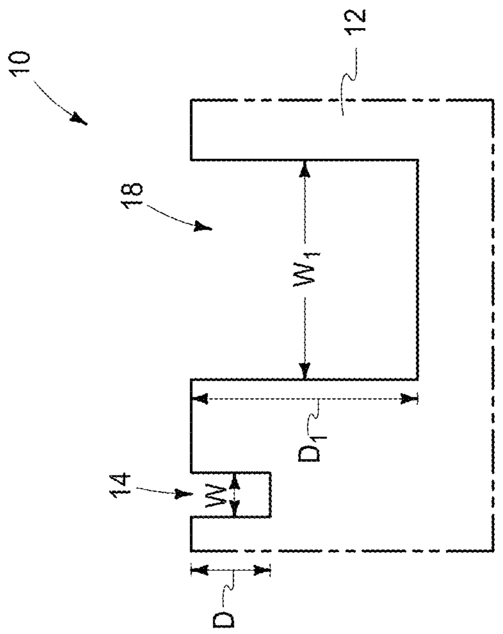
FIGS. 1 and 1A are a top view and diagrammatic cross-sectional side view, respectively, of an example semiconductor construction having openings extending therein. The view of FIG. 1A is along the line 1A-1A of FIG. 1.
Figure 1:
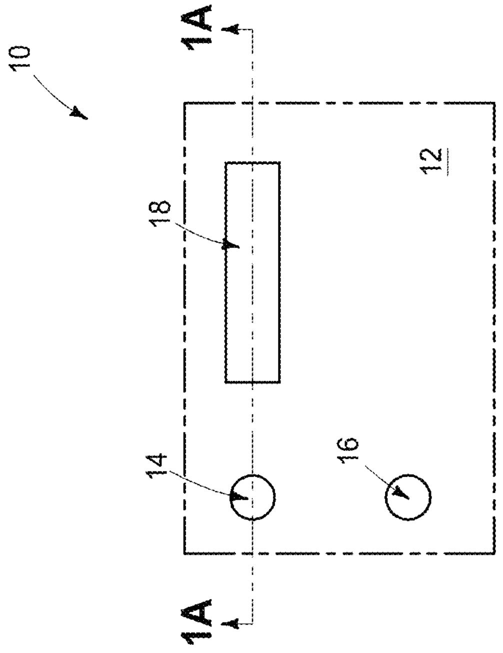

FIGS. 1 and 1A illustrate an example construction 10, which includes a base 12 having openings 14, 16 and 18 extending therein. The openings 14 and 16 are circular in the top view of FIG. 1, and the opening 18 is rectangular. The illustrated openings are example openings, and in other applications the openings may have other shapes. For instance, some of the openings may be elliptical, square, etc. when viewed from above. The openings 14, 16 and 18 may be considered to be examples of openings having a distribution of sizes relative to one another. In the shown embodiment, the openings 14 and 16 are about the same size as one another in the top view of FIG. 1, and the openings 14 and 16 have smaller areas than opening 18. The cross-sectional view of FIG. 1A further illustrates that the openings 14 and 18 are different sizes relative to one another. Specifically, the opening 14 has a width W which is smaller than a width $W_1$ of the opening 18; and has a depth D which is shallower than a depth $D_1$ of the opening 18. In some embodiments, the width W may be less than about 1 micrometer (μm), and the width $W_1$ may be at least about 4 μm. In some embodiments, the depth D may be at least about 500 nanometers (nm), at least about 1 μm, etc.; and the depth $D_1$ may be at least about 2 μm, at least about 4 μm, etc.

In some embodiments, it may be desired to fill the openings 14 and 18 with insulative material. In some embodiments, the opening 18 may be representative of an opening extending to large region which is desired to be covered with insulative material. For instance, opening 18 may extend to a staircase region adjacent a memory array (for instance, a NAND memory array). Although the bottom of opening 18 is shown to be flat, it is to be understood that the bottom may be more of a stadium (i.e. tiered) configuration if the opening 18 extends to a staircase region (with an example stadium configuration along the bottom of opening 18 being described below with reference to FIG. 10J). The opening 14 may be representative of an opening within a memory array region, or adjacent a memory array region, which is desired to be plugged with insulative material.

The base 12 may comprise semiconductor material; and may, for example, comprise, consist essentially of, or consist of monocrystalline silicon. The base 12 may be referred to as a semiconductor substrate or semiconductor construction. The terms "semiconductor substrate" and "semiconductor construction" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 12 may correspond to a semiconductor substrate containing one or more materials associated with integrated circuit fabrication. Such materials may include, for example, one or more of refractory metal materials, barrier materials, diffusion materials, insulator materials, etc.

In some embodiments, it may be desired to fill the openings 14 and 18 with conductive material to form conductive contacts and/or plates within the openings.

Numerous example methods for filling the openings of construction 10 with one or more materials are described herein. Such methods may be utilized separately, or in combination; and may be utilized with one or more insulative materials, conductive materials, etc.

An example embodiment for utilization of spray particles to fill the openings of construction 10 is described with reference to FIGS. 2A-2G.

Figures 2A, 2B, 2C, 2D:
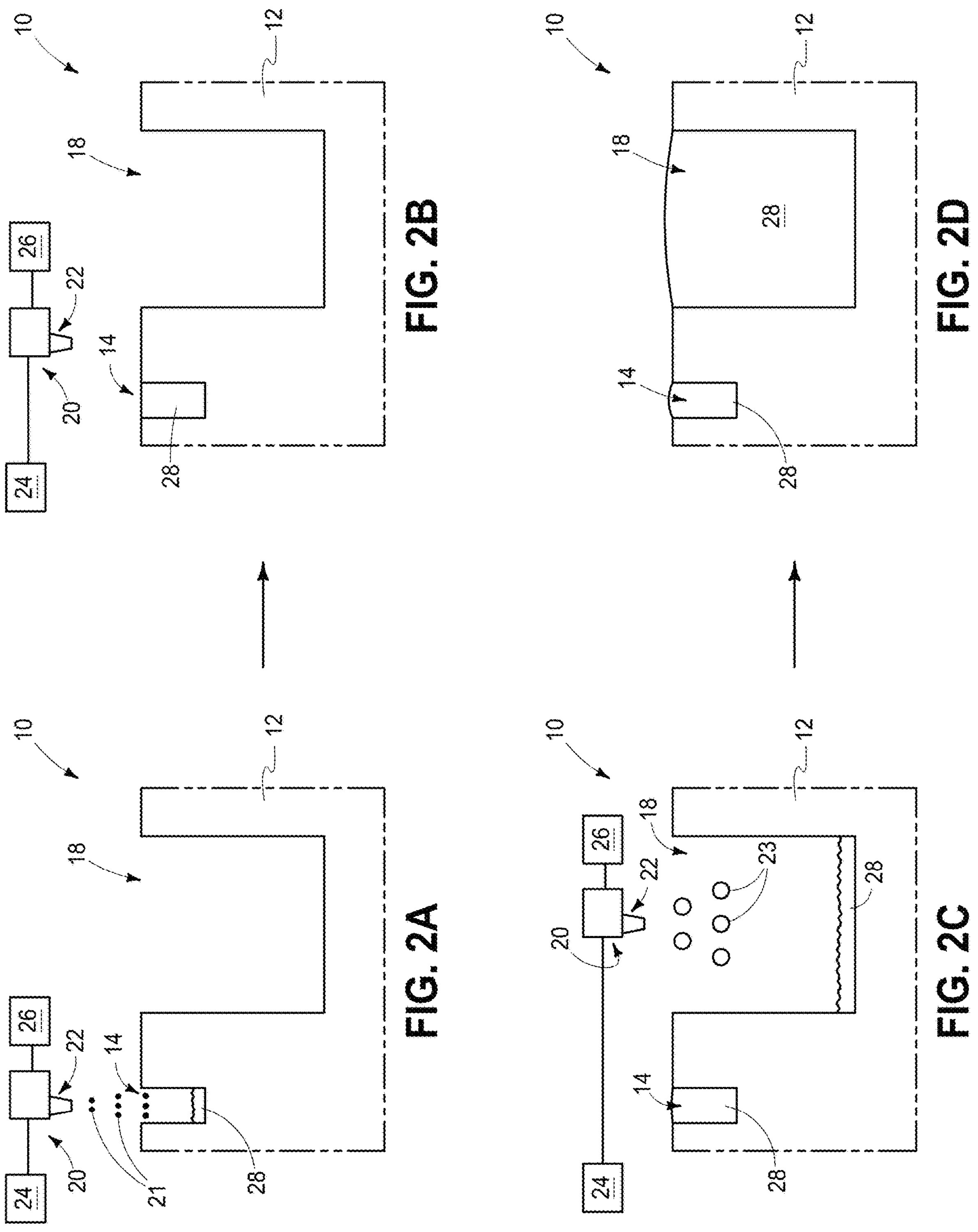
FIGS. 2A-2D are diagrammatic cross-sectional side views of the semiconductor construction of FIG. 1A at processing stages of an example method for forming material within openings.

Referring to FIG. 2A, an example applicator 20 is shown proximate the opening 14 of construction 10. The applicator 20 includes a nozzle 22. The nozzle 22 is in fluid communication with a reservoir 24 containing material which is to be deposited within the openings that extend into base 12 (e.g., openings 14 and 18 of FIG. 2A). The material within the reservoir may be in any suitable form. For instance, the material within the reservoir 24 may be in liquid form in some embodiments, in powder form in some embodiments, etc.

The applicator 20 may have any suitable configuration, and in some embodiments may be a printhead.

Spray particles 21 (only some of which are labeled) are shown to be ejected from nozzle 22 and into opening 14. The spray particles accumulate within the opening 14 as a material 28. The spray particles may have any suitable form. For instance, in some embodiments the spray particles may be drops of liquid. As another example, in some embodiments the spray particles may be aggregates of solid (e.g., powder particles).

The nozzle 22 is coupled with control circuitry 26 which enables the nozzle to be moved (e.g. rastered) relative to base 10, and which enables physical characteristics of the spray particles 21 to be modified. The modifiable physical properties may include, for example, one or more of average spray particle size, spray particle density (which may be measured as dots-per-inch of the spray particles in embodiments in which the applicator is a printhead), lateral speed of the spray particles relative to a surface of the base 12, ionic charge imparted to the spray particles, etc.

Referring to FIG. 2B, opening 14 is filled with the material 28, and the applicator 22 is moved toward the opening 18.

Referring to FIG. 2C, spray particles 23 (only some of which are labeled) are directed into opening 18. The spray particles 23 have different physical properties than the spray particles 21 (FIG. 2A), and in the shown embodiment are larger than the spray particles 21. In other embodiments, the spray particles 23 may be smaller than the spray particles 21 and/or may differ from the spray particles 21 in other properties; such as, for example, the density of spray particles 23 as compared to the density of spray particles 21, the lateral speed of the spray particles 23 relative to the bottom surface of opening 18 at the processing stage of FIG. 2C as compared to the lateral speed of the spray particles 21 relative to the bottom surface of opening 14 at the processing stage of FIG. 2A, the ionic charge imparted to spray particles 23 (if any) as compared to the ionic charge imparted to spray particles 21 (if any), etc.

In some embodiments, at least some of the spray particles 21 (FIG. 2A) and 23 (FIG. 2C) ejected by the nozzle 22 are very small (e.g., have an average volume of less than or equal to about 0.5 picoliters). Such small spray particles may provide improved uniformity of coverage, particularly over uneven surfaces, as compared to larger spray particles.

Referring to FIG. 2D, construction 10 is shown after openings 14 and 18 have both been filled with material 28. In subsequent processing, construction 10 may be subjected to thermal processing (e.g., a bake) and/or other suitable processing to cure material 28. For instance, in some embodiments the deposited material 28 may correspond to an insulative material conventionally utilized for spin-on applications, and it may be desired to cure the deposited insulative material 28 with a bake at a process stage subsequent to the fill of openings 14 and 18.

The material 28 may comprise any suitable material. In some embodiments, the material 28 may comprise one or both of perhydropolysilazane and siloxane. The term "siloxane" being generic to a class of polymers having siloxane bonds and side groups (for instance, H and/or organic side groups, such as methyl, phenyl, vinyl, etc.). The term "perhydropolysilazane" being generic to perhydropolysilazane itself, and to perhydropolysilazane derivatives. In some embodiments, the material 28 may correspond to a conductive material, and may comprise silver particles (and/or other conductive particles) dispersed within one or both of perhydropolysilazane and siloxane.

The embodiment of FIG. 2D has all of the material 28 provided within openings 14 and 18, and shows very little overfill of the openings 14 and 18. In some embodiments, there may be no overfill of the openings 14 and 18. To the extent that there is some overfill of the openings, such overfill may be modest and may be nonproblematic. If it is desired to remove the overfill, such may be accomplished with chemical-mechanical polishing (CMP) and/or other suitable processing.

In some embodiments, it may be desired to form an adhesion-promoting liner within openings 14 and 18 prior to the deposition of material 28; and/or it may be desired to form an adhesion-reducing liner along surfaces of the base 12 between the openings. The adhesion-promoting liner may enhance adhesion of material 28 within the openings 14 and 18. The adhesion-reducing liner may diminish adhesion of material 28 across regions of base 12 between the openings to reduce or eliminate overburden of material 28 along regions of base 12 between the openings 14 and 18. The adhesion-reducing liner may have an upper surface with properties such that material 28 does not adhere well to such upper surface, or may even repel material 28.

Figure 2F:
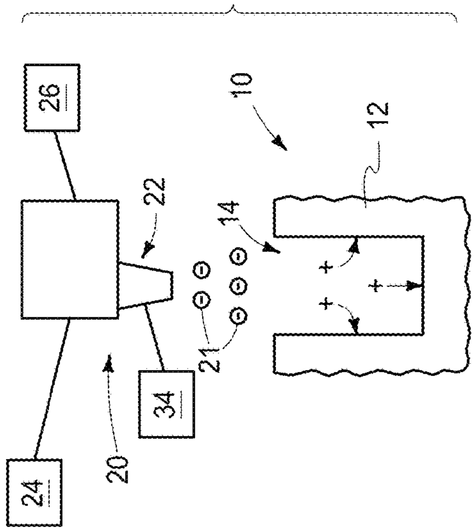
FIG. 2F is a diagrammatic cross-sectional side view of a region of the semiconductor construction of FIG. 1A at an example processing stage.
Figure 2E:
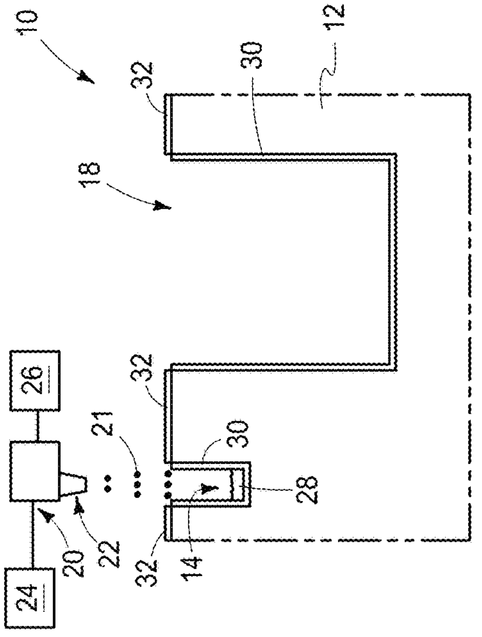
FIG. 2E is a diagrammatic cross-sectional side view of the semiconductor construction of FIG. 1A at a processing stage alternative to that of FIG. 2A.

FIG. 2E shows construction 10 at a processing stage analogous to that of FIG. 2A, but in which an adhesion-promoting liner 30 is provided along surfaces of base 12 within openings 14 and 18, and in which an adhesion-reducing liner 32 is provided over surfaces of base 12 between the openings 14 and 18.

The adhesion-promoting liner may comprise any suitable composition or combination of compositions. If material 28 comprises insulative material, it may be desired for the adhesion-promoting liner 30 to also comprise insulative material; and in such embodiments the adhesion-promoting liner 30 may comprise, for example, one or more of silicon dioxide, silicon nitride, aluminum oxide, hafnium oxide, titanium oxide, etc. If material 28 comprises conductive material, it may be desired for the adhesion-promoting liner 30 to also comprise conductive material; and in such embodiments the adhesion-promoting liner 30 may comprise conductively-doped semiconductor material (e.g., conductively-doped silicon, conductively-doped germanium, etc.), metal (e.g., tungsten, titanium, etc.), metal nitride (e.g., titanium nitride, tungsten nitride, etc.), etc.

The adhesion-reducing liner 32 may comprise any suitable composition or, combination of compositions; and in some embodiments may comprise fluorocarbon material (with example fluorocarbon material being described below with reference to FIG. 10A).

The configuration of FIG. 2E may be subjected to processing analogous to that of FIGS. 2B and 2C to eventually fill the openings 14 and 18 and form a construction analogous to that described above with reference to FIG. 2D.

In some embodiments, it may be desired to impart an ionic charge onto the spray particles 21 (FIG. 2A), and/or to impart an ionic charge onto the spray particles 23 (FIG. 2C). FIG. 2F shows nozzle 22 coupled with circuitry 34 configured to impart ionic charge to the spray particles emitted from nozzle 22 (the spray particles are illustrated as the particles 21, but in other embodiments the spray particles may be the particles 23). In the shown embodiment, the spray particles are provided with a negative ("−") charge, but in other embodiments may be provided with a positive ("+") charge. Also, sidewalls within opening 14 is shown provided with the positive charge which may assist in retaining the spray particles 21 within the opening 14. The positive charge may be provided along the sidewalls of opening 14 with any suitable methodology, including, for example, providing a charge along the base 12 with appropriate circuitry (not shown).

Figure 2G:
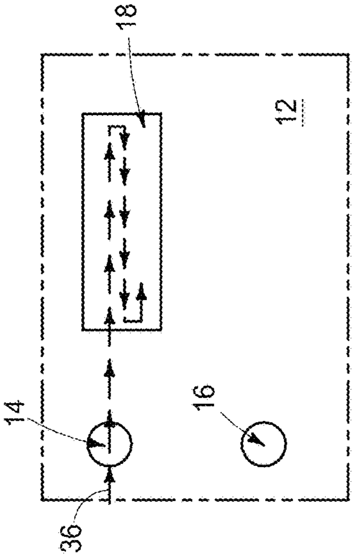
FIG. 2G is a diagrammatic top view of the semiconductor construction of FIG. 1 at an example processing stage.

As discussed above, the nozzle 22 may be rastered or otherwise moved relative to the base 12. FIG. 2G shows an example path 36 for the nozzle 22 (shown in FIG. 2A) across the openings 14 and 18 associated with the base 12. In some embodiments, opening 14 may be small enough relative to a spray pattern of the nozzle 22 so that the opening 14 can be filled with a single pass of the nozzle 22, and opening 18 is large enough relative to the spray pattern of the nozzle to require multiple passes of the nozzle. Accordingly, the path 36 is shown crossing opening 14 once, and rastering multiple times across opening 18 to fill the opening 18. In other embodiments, the opening 14 may be large enough relative to a spray pattern of the nozzle 22 to make it necessary to raster the nozzle multiple times across opening 14. In other embodiments, the opening 18 may be narrow enough relative to the spray pattern of the nozzle 22 so that the opening 18 may be filled with only a single pass of the nozzle 22.

Figure 3A:
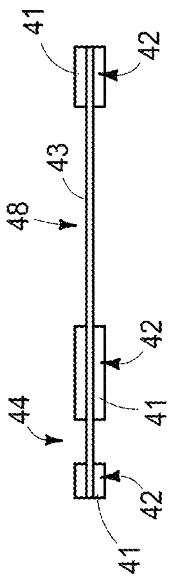
FIGS. 3 and 3A are a top view and diagrammatic cross-sectional side view, respectively, of an example masking screen. The view of FIG. 3A is along the line 3A-3A of FIG. 3.
Figure 3:
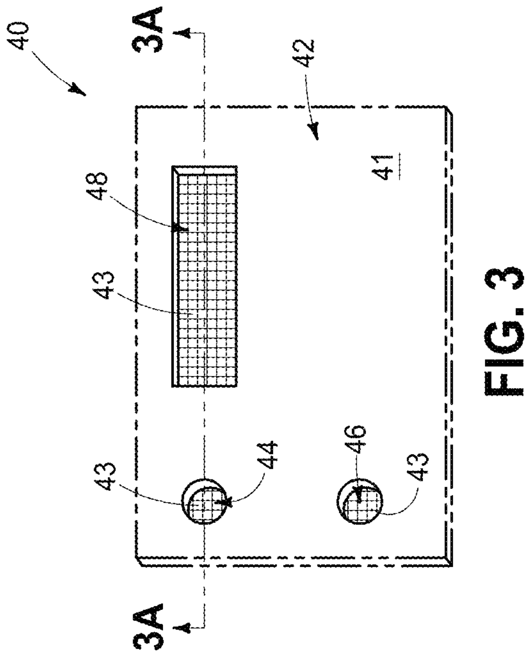

Another series of example methods for filling openings with material is described with reference to FIGS. 3, 3A and 4A-F. Referring to FIGS. 3 and 3A, a patterned screening structure 40 is formed to have a blocked region 42 and unblocked regions 44, 46 and 48. The unblocked regions 44, 46 and 48 are in a pattern complementary relative to the pattern of the openings 14, 16 and 18 of the semiconductor construction 10 of FIG. 1.

The unblocked regions 44, 46 and 48 comprise mesh (screen) 43, and the blocked region 42 comprises solid material 41 over the screen 43.

The screening structure 40 may be formed of any suitable material; and in some embodiments may be formed from flexible metal-containing material (e.g., metal foil), flexible polymeric material (e.g., organic polymer), silicate-containing material, semiconductor material, etc. The unblocked regions 44, 46 and 48 (i.e., the illustrated mesh regions) may be patterned with any suitable methodology. For instance, in some embodiments a flexible mesh may be entirely covered with the solid material 41. Subsequently, regions of material 41 may be selectively removed relative to the mesh 43 to pattern the unblocked regions 44, 46 and 48. In some embodiments, the mesh 43 may comprise polymeric material while the solid material 41 comprises metal. In some embodiments, the mesh 43 may comprise metal while the solid material 41 comprises polymeric material. In some embodiments, the mesh 43 may comprise polymeric material and/or metal while the solid material 41 comprises silicate-containing material, semiconductor material, etc.

Figures 4A, 4B, 4C, 4D:
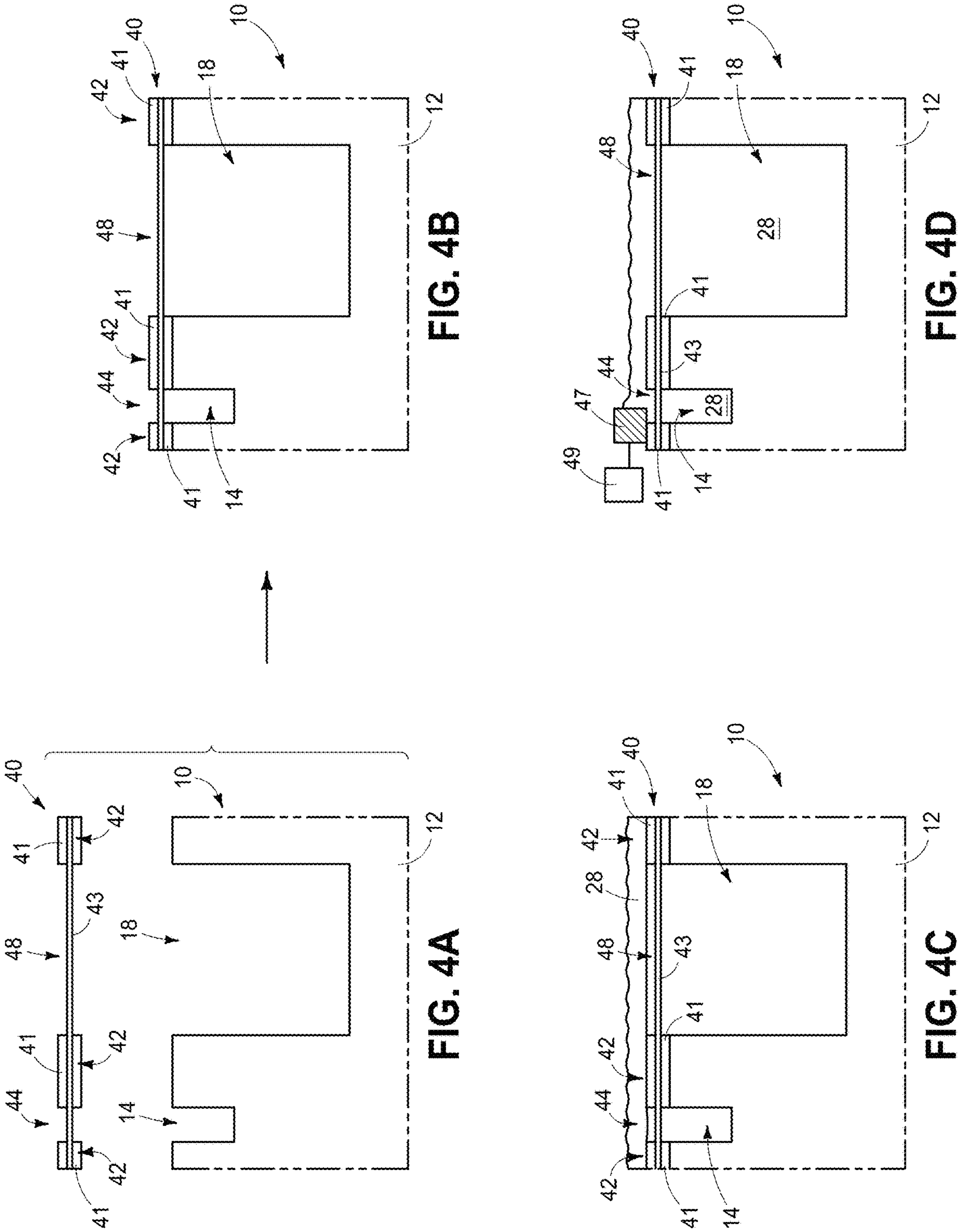
FIGS. 4A-4D are diagrammatic cross-sectional side views of the semiconductor construction of FIG. 1A and the masking screen of FIG. 3A at processing stages of an example method for forming material within openings.

Referring to FIG. 4A, the patterned screening structure 40 is aligned with the semiconductor base 10. Specifically, unblocked regions 44 and 48 are aligned with openings 14 and 18 in the shown cross-sectional view; and blocked regions 42 are aligned with segments of the semiconductor substrate 12 between the openings 14 and 18.

Referring to FIG. 4B the aligned patterned screening structure 40 is placed onto the semiconductor substrate 12.

Referring to FIG. 4C, a mass of material 28 is deposited onto the patterned screening structure 40. The material 28 may comprise any suitable material; including, for example, insulative material, conductive material, etc.; and in some embodiments may comprise one or more of the materials described above relative to the embodiment of FIGS. 2A-2D.

Referring to FIG. 4D, material 28 is spread across the patterned screening structure 40 with a bar 47 (or other suitable tool); and the material 28 is pressed through the unblocked regions 44 and 48, and into the openings 14 and 18 during such spreading of material 28. In the shown embodiment, the bar 47 is coupled with a control mechanism 49 which may move the bar across the patterned screening structure 40, and which may push the bar onto patterned screening structure with sufficient force to push material 28 through unblocked regions 44 and 48 and into the openings 14 and 18.

Figure 4F:
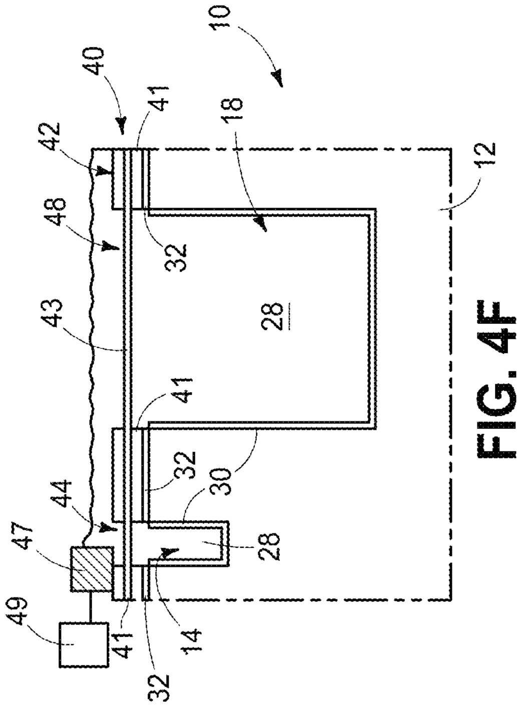
FIG. 4F is a diagrammatic cross-sectional side view of the semiconductor construction of FIG. 1A and the screen of FIG. 3A at an example processing stage alternative to that of FIG. 4D.
Figure 4E:
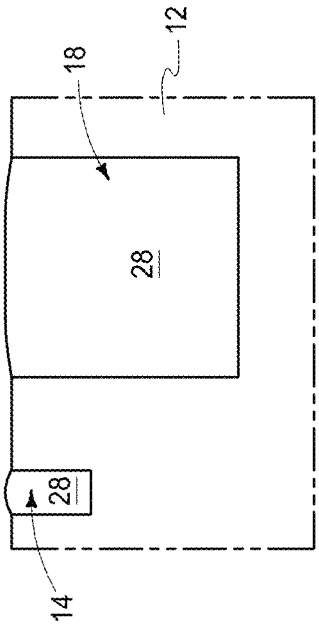
FIG. 4E is a diagrammatic cross-sectional side view of the semiconductor construction of FIG. 1A at an example processing stage following that of FIG. 4D.

Referring to FIG. 4E, the patterned screening structure 40 (FIG. 4D) is removed, together with any excess material 28 over the patterned screening structure; and material 28 is left within openings 14 and 18. Construction 10 may be subsequently subjected to thermal processing (e.g., a bake) and/or other suitable processing to cure material 28.

The embodiment of FIG. 4E has all of the material 28 provided within openings 14 and 18, and shows very little overfill of the openings 14 and 18. In some embodiments, there may be no overfill of the openings 14 and 18. To the extent that there is some overfill of the openings, such overfill may be modest and may be nonproblematic. If it is desired to remove the overfill, such may be accomplished with CMP and/or any other suitable processing.

In some embodiments, it may be desired to form the adhesion-promoting liner 30 (FIG. 2E) within openings 14 and 18 prior to the deposition of material 28; and/or it may be desired to form the adhesion-reducing liner 32 (FIG. 2E) along surfaces of the base 12 between the openings. For instance, FIG. 4F shows construction 10 at a processing stage analogous to that of FIG. 4D, but in which the adhesion-promoting liner 30 is provided along surfaces of base 12 within openings 14 and 18, and in which the adhesion-reducing liner 32 is provided over surfaces of the base 12 between the openings 14 and 18.

Figure 5A:
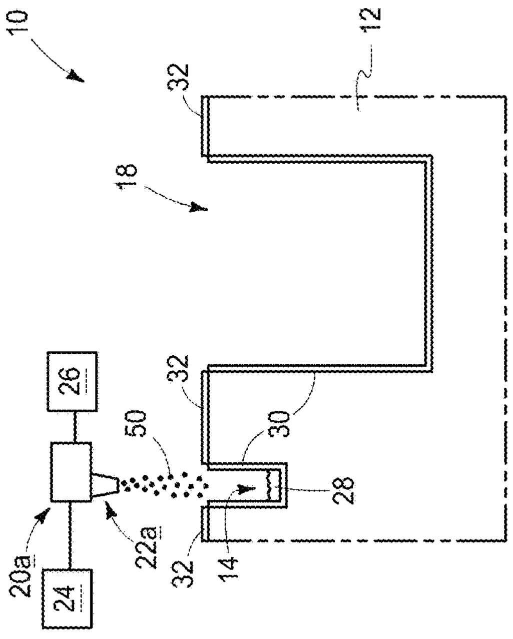
FIGS. 5A-5C are diagrammatic cross-sectional side views of the semiconductor construction of FIG. 1A at processing stages of an example method for forming material within openings.

Another series of example methods for filling openings with material is described with reference to FIGS. 5A-D. Referring to FIG. 5A, construction 10 is shown at a processing stage analogous to that of FIG. 2E, except that the applicator 20 of FIG. 2E is replaced with an applicator **20*a* configured to emit very fine aerosol drops from a nozzle 22*a*. In some embodiments, the drops may have average cross-sectional dimensions of less than or equal to about 50 nm. The cross-sectional dimension may be measured across the diameter of a spherical drop, as shown in FIG. 5D. Specifically, FIG. 5D shows an example spherical drop 50, and shows such drop having a cross-sectional dimension 52** across a diameter of the drop. In other embodiments, the drops may have other shapes, and the average cross-sectional dimensions may be determined with other measurements.

In some embodiments, the aerosol drops may have average cross-sectional dimensions of less or equal to about 5 nm. In some embodiments, an average volume of the individual aerosol drops may be less than or equal to about 0.5 picoliters.

The applicator **20*a*** may comprise any suitable configuration, and in some embodiments may comprise an ultrasonic atomizer.

In the shown embodiment, the adhesion promoting liner 30 is provided within openings 14 and 18 of construction 10, and the adhesion-reducing liner 32 is provided over surfaces of the base 12 between the openings 14 and 18. In other embodiments, one or both of the liners 30 and 32 may be omitted.

The material 28 is dispersed within the opening 14 as the aerosol drops 50, and such aerosol drops may uniformly fill such opening.

Figure 5B:
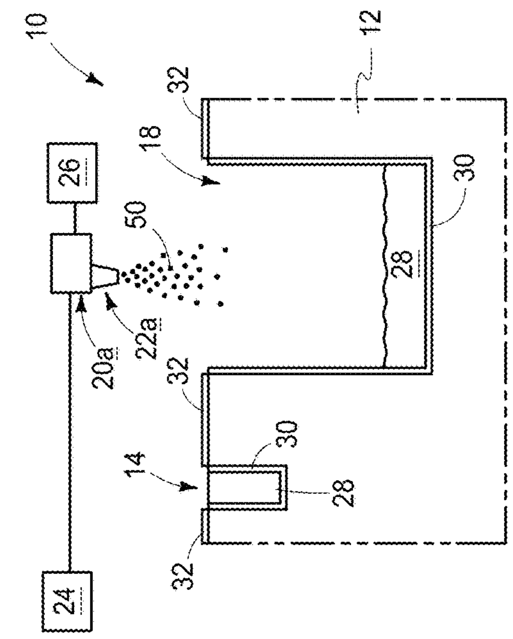

Referring to FIG. 5B, the applicator **20*a* is moved over opening 18, and the same small drops 50 are dispersed within opening 18 to uniformly fill the opening with material 28**.

Figure 5C:
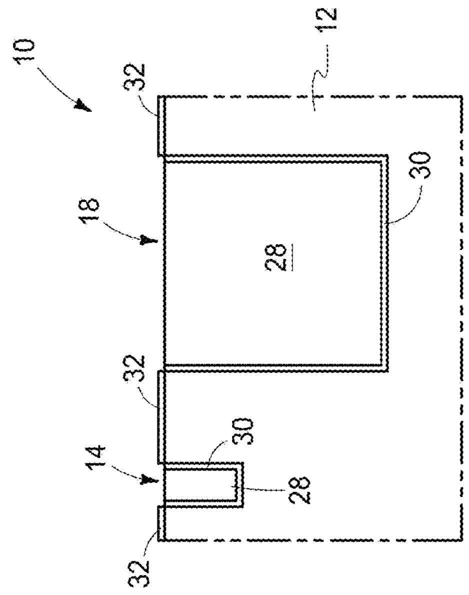
Figure 5D:
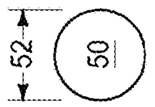
FIG. 5D is a diagrammatic cross-sectional side view of an example spray particle.

Referring to FIG. 5C, construction 10 is shown at a processing stage after openings 14 and 18 are filled with material 28. In the shown embodiment, the material 28 has a flat upper surface which is substantially planar with an upper surface of base 12. In other embodiments, there may be some overburden of material 28 within one or both of openings 14 and 18, and/or there may be some overburden of material 28 on upper surfaces of the base 12 between the openings 14 and 18. To the extent that there is overburden of material 28, such may remain in the finished construction if the overburden is minor; or may be removed by CMP and/or other suitable processing if desired.

Figure 6:
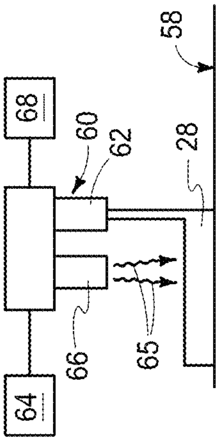
FIG. 6 is a diagrammatic cross-sectional side view of an example apparatus configured for printing material and treating the material.

Another series of example methods for filling openings with material is described with reference to FIGS. 6 and 7A-E. Referring to FIG. 6, an applicator 60 is shown provided proximate a surface 58. The applicator 60 includes a printhead 62 which is in fluid communication with a reservoir 64 containing material which is to be applied. The applicator 60 also comprises a treatment-head 66 which is coupled with the printhead 64 (i.e. which is joined to the printhead), and which moves with the printhead. The applicator is controlled with a control mechanism 68 shown proximate the applicator 60.

In operation, material 28 is printed by the printhead 62, and then cured utilizing an emission from the treatment-head 66 (with emissions from the treatment-head being diagrammatically illustrated in FIG. 6 with wavy line arrows 65). In some embodiments, material 28 may comprise perhydropolysilazane and/or siloxane; and the curing of such material may be accomplished with thermal energy (heat) emitted from the treatment-head 66. In some embodiments, material 28 may comprise photo-curable material; such as one or more of siloxane, silsesquioxane and diazonapthoquinone. The curing of such photo-curable material may be accomplished with electromagnetic radiation emitted from the treatment-head 66. The term "silsesquioxane" is to be understood to be generic to a class of polymers having monomers with the chemical formula $RSiO_{3/2}$; where R is hydrogen and/or organic groups. The term "diazonapthoquinone" is to be understood to be generic to diazonapthoquinone itself, and to diazonapthoquinone derivatives.

The printed material 28 may comprise any suitable material which may be printed and then cured with an emission from the treatment-head 66. The printed material 28 may be an insulative material, a conductive material, etc. If it is desired for printed material 28 to be a conductive material, silver particles (or other suitable conductive particles) may be dispersed within one or more of siloxane, silsesquioxane and diazonapthoquinone to form photo-curable conductive material.

Figure 7A:
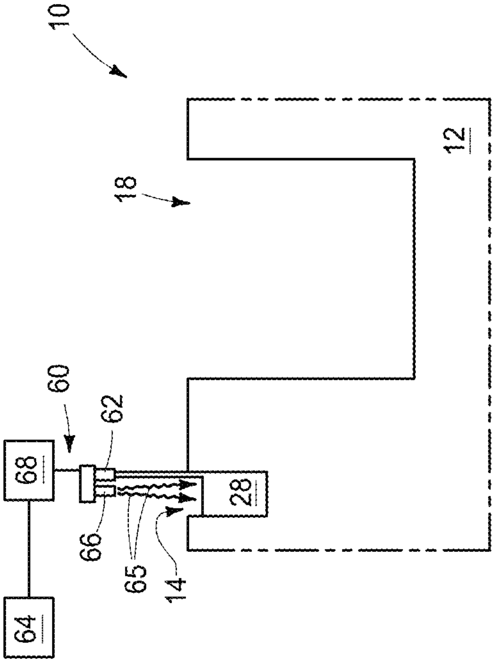
FIGS. 7A and 7B are diagrammatic cross-sectional side views of the semiconductor construction of FIG. 1A and the apparatus of FIG. 6 at processing stages of an example method for forming material within openings.

Referring to FIG. 7A, the applicator 60 is provided proximate the semiconductor construction 10, and specifically is provided over opening 14. The applicator 60 is utilized to fill opening 14 with material 28.

Figure 7C:
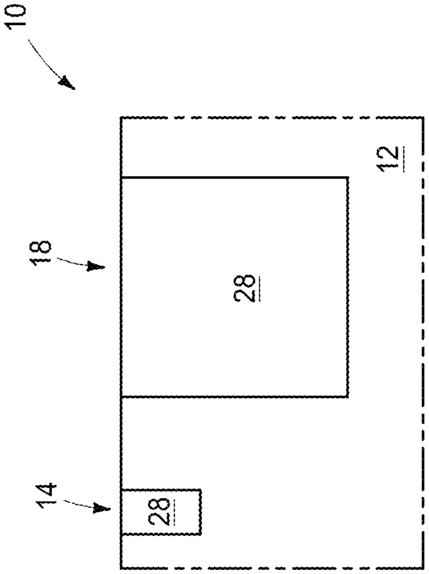
FIG. 7C is a diagrammatic cross-sectional side view of the semiconductor construction of FIG. 1A at an example processing stage following that of FIG. 7B.
Figure 7B:
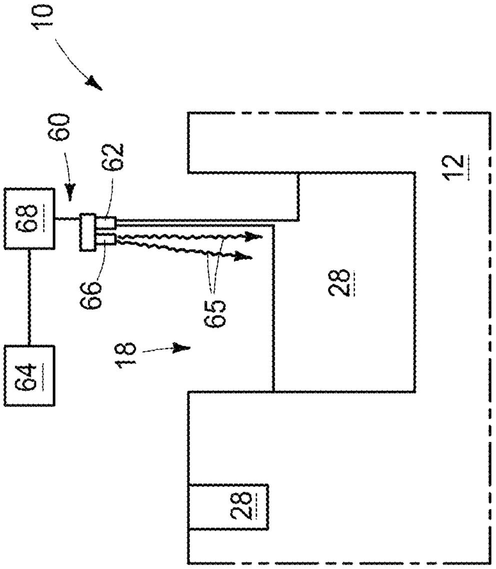

Referring to FIG. 7B, the applicator 60 is moved to over opening 18 after opening 14 is filled with material 28. The applicator 60 is then utilized to fill opening 18 with material 28. In some applications, the printed material 28 may be directed into openings 14 and 18 as spray particles and physical characteristics of the spray particles may be varied as the spray particles are directed into the larger opening 18 as compared to when the spray particles are directed into the smaller opening 14 (e.g., using processing analogous to that discussed above with reference to FIGS. 2A-2C).

Referring to FIG. 7C, construction 10 is shown after openings 14 and 18 are filled with material 28. The material 28 is shown filling the openings 14 and 18 to a level such that there is no overburden of material 28. In some applications, there may be some overburden. If the overburden is minor, such may be left in a final construction. If it is desired to remove the overburden, such may be accomplished with CMP and/or any other suitable processing.

Figure 7D:
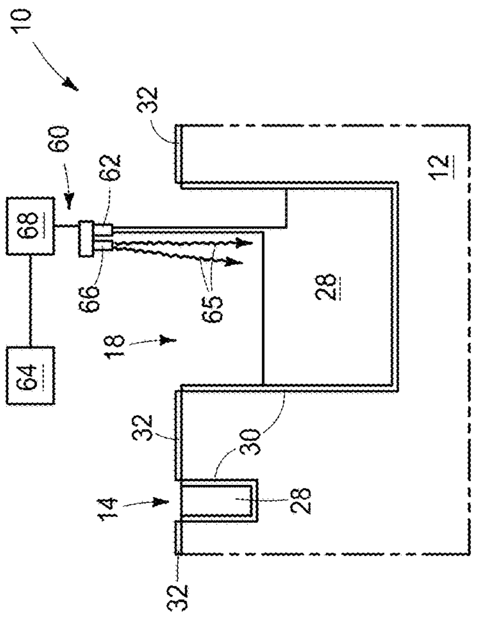
FIG. 7D is a diagrammatic cross-sectional side view of the semiconductor construction of FIG. 1A and the apparatus of FIG. 6 at an example processing stage alternative to that of FIG. 7B.
Figure 7E:
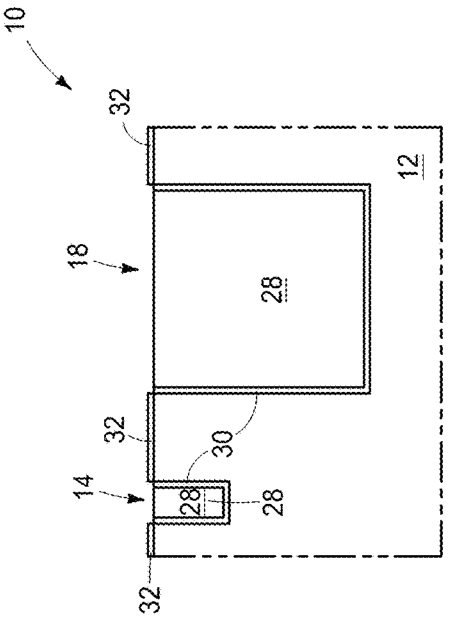
FIG. 7E is a diagrammatic cross-sectional side view of the semiconductor construction of FIG. 1A at an example processing stage alternative to that of FIG. 7C.

In some embodiments, it may be desired to form the adhesion-promoting liner 30 (FIG. 2E) within the openings 14 and 18 prior to the deposition of material 28; and/or it may be desired to form the adhesion-reducing liner 32 (FIG. 2E) along surfaces of the base 12 between the openings. For instance, FIG. 7D shows construction 10 at a processing stage analogous to that of FIG. 7B, but in which the adhesion-promoting liner 30 is provided along surfaces of base 12 within the openings 14 and 18, and in which the adhesion-reducing liner 32 is provided over surfaces of base 12 between the openings 14 and 18. FIG. 7E shows construction 10 at a processing stage subsequent to that of FIG. 7D, and shows the openings 14 and 18 filled with material 28.

Figure 8:
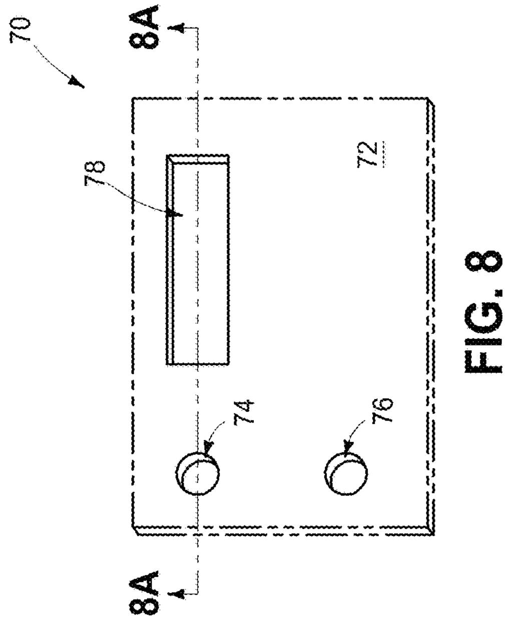
FIGS. 8 and 8A are a top view and diagrammatic cross-sectional side view, respectively, of an example plate. The view of FIG. 8A is along the line 8A-8A of FIG. 8.
Figure 8A:
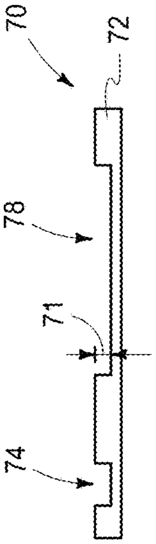

Another series of example methods for filling openings with material is described with reference to FIGS. 8, 8A and 9A-F. Referring to FIGS. 8 and 8A, a plate (or other suitable template) 70 is formed to have headspace regions 74, 76 and 78 in a pattern complementary relative to the pattern of the openings 14, 16 and 18 of the semiconductor construction 10 of FIG. 1. The headspace regions may have depths within the plate (shown as depths 71 in FIG. 8A) of at least about 50 nm. In some embodiments, such depths may be within a range of from about 50 nm to about 200 nm. The headspace regions 74, 76 and 78 may have the same depths as one another, or at least one of the headspace regions may have a different depth relative to one or more of the others.

The plate 70 may comprise any suitable material 72; including, for example, metal, semiconductor, organic polymer, etc. The pattern of headspace regions 74, 76 and 78 may be formed in the plate 70 with any suitable methodology. For instance, locations of the headspace regions may be defined with a patterned mask formed over plate 70, then the headspace regions may be etched into the plate 70, and then the patterned mask may be removed to leave the construction of FIGS. 8 and 8A. The patterned mask may comprise, for example, a photolithographically-patterned photoresist mask.

Figure 9A:
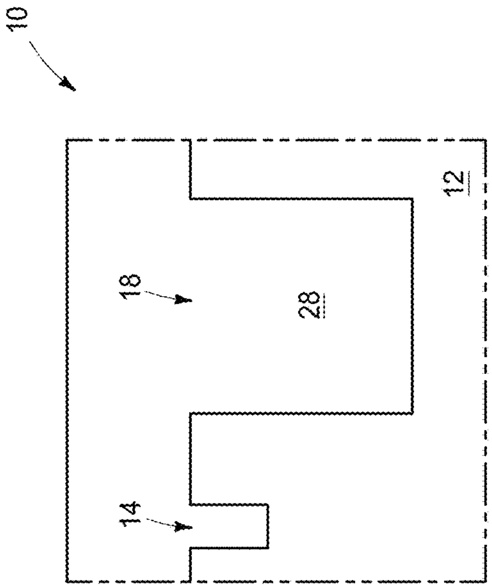
FIGS. 9A-9C are diagrammatic cross-sectional side views of the semiconductor construction of FIG. 1A and the plate of FIG. 8A (shown in FIGS. 9B and 9C) at processing stages of an example method for forming material within openings. The plate of FIG. 8A is inverted in FIGS. 9B and 9C relative to the view of FIG. 8A.

Referring to FIG. 9A, material 28 is dispersed over substrate 10 and within openings 14 and 18. The material 28 of FIG. 9A may comprise any suitable material, including, for example, spin-on dielectric material. In some embodiments, the material 28 of FIG. 9A may comprise perhydropolysilazane and/or siloxane.

Figure 9B:
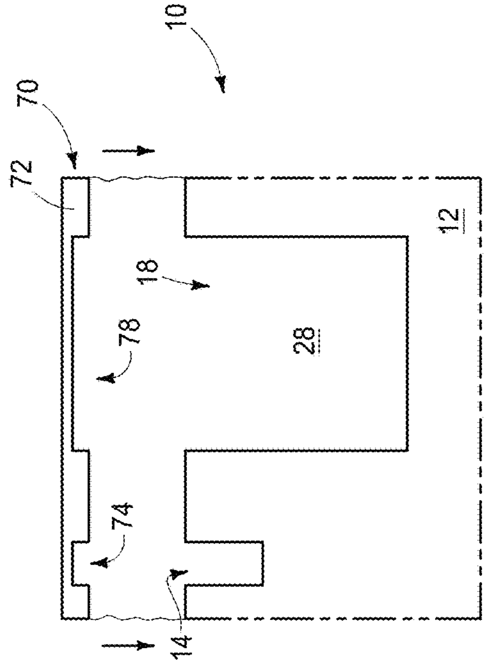

Referring to FIG. 9B, the plate 70 is provided over material 28 and aligned such that the headspaces 74 and 78 are over the openings 14 and 18.

Figure 9C:
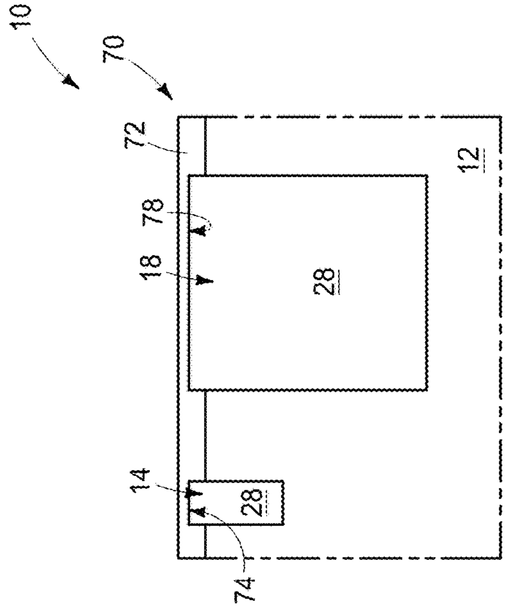

Referring to FIG. 9C, the plate 70 is pressed onto a surface of the semiconductor substrate 12 to force the material 28 away from regions of the substrate 12 between the openings 14 and 18, while leaving the material 28 within the openings 14 and 18. The headspaces enable pressure to be relieved relative to the material 28 within the openings 14 and 18 as compared to applications in which an analogous plate is utilized lacking such headspaces. The relieved pressure on the material 28 within the openings 14 and 18 may alleviate or prevent cracking of material 28 and/or of the semiconductor substrate 12 in regions adjacent material 28, as compared to applications utilizing a conventional plate analogous to plate 70 but lacking the headspaces.

Figure 9D:
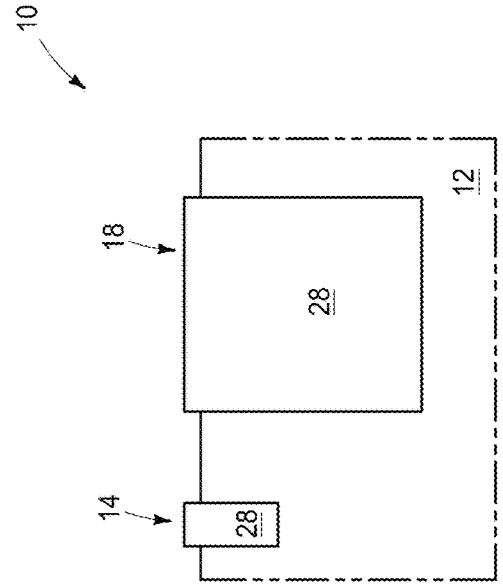
FIG. 9D is a diagrammatic cross-sectional side view of the semiconductor construction of FIG. 1A at an example processing stage following that of FIG. 9C.

Referring to FIG. 9D, construction 10 is shown at a processing stage subsequent to that of FIG. 9C, and after the plate 70 (FIG. 9C) is removed. Construction 10 may be subjected to thermal processing (e.g., a bake) and/or other suitable processing to cure material 28 before or after the plate 70 is removed. In some embodiments, it may be desired to remove the plate 70 before thermal treatment, particularly if material 28 or substrate 12 undergoes expansion or contraction during the thermal treatment.

The embodiment of FIG. 9D has some overfill of the openings 14 and 18. The overfill may be modest and may be nonproblematic. If it is desired to remove the overfill, such may be accomplished with CMP and/or any other suitable processing.

Figure 9F:
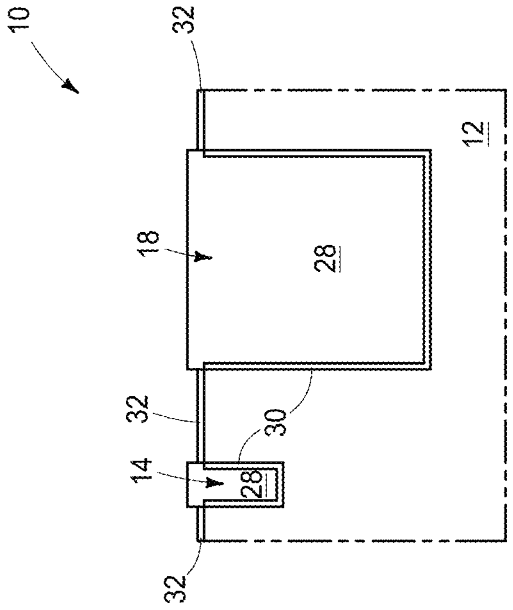
FIG. 9F is a diagrammatic cross-sectional side view of the semiconductor construction of FIG. 1A at an example processing stage alternative following that of FIG. 9E.
Figure 9E:
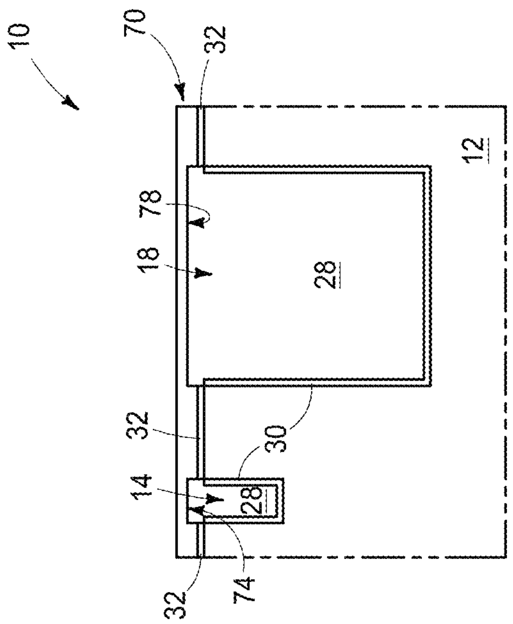
FIG. 9E is a diagrammatic cross-sectional side view of the semiconductor construction of FIG. 1A and the plate of FIG. 8A at an example processing stage alternative to that of FIG. 9C.

In some embodiments, it may be desired to form the adhesion-promoting liner 30 (FIG. 2E) within openings 14 and 18 prior to the deposition of material 28; and/or it may be desired to form the adhesion-reducing liner 32 (FIG. 2E) along surfaces of the base 12 between the openings. For instance, FIG. 9E shows construction 10 at a processing stage analogous to that of FIG. 9C, but in which the adhesion-promoting liner 30 is provided along surfaces of base 12 within openings 14 and 18, and in which the adhesion-reducing liner 32 is provided over surfaces of base 12 between the openings 14 and 18. FIG. 9F shows construction 10 at a processing stage subsequent to that of FIG. 9E, and shows the openings 14 and 18 filled with material 28. CMP and/or other suitable planarization may follow the processing stage of FIG. 9F in some embodiments.

The processing of FIGS. 8 and 9 may utilize nanoimprint technology in some embodiments.

Another series of example methods for filling openings with material is described with reference to FIGS. 10A-I. Referring to FIG. 10A, the semiconductor construction 10 is shown at a processing stage prior to formation of the openings 14 and 18 (FIG. 1A) therein. The construction 10 includes the semiconductor substrate (i.e. base) 12, and a layer of adhesion-reducing material 33 over the base 12. The adhesion-reducing material 33 may comprise any suitable composition or combination of compositions; and in some embodiments may comprise, consist essentially of, or consist of fluorocarbon material. The term "fluorocarbon" is to be understood to be generic to fluorocarbon derivatives and to include hydrofluorocarbons. In some embodiments, the fluorocarbon material may comprise, consist essentially of, or consist of polytetrafluoroethylene (PTFE).

Figure 10A:
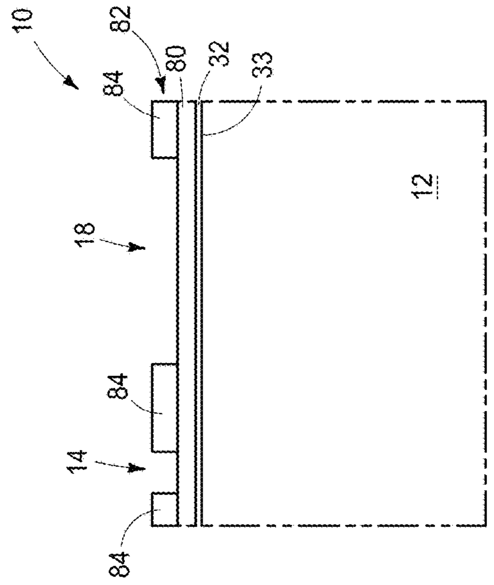
FIGS. 10A-10D are diagrammatic cross-sectional side views of a semiconductor construction at process stages of an example method for forming material within openings.

The adhesion-reducing material 33 (e.g., fluorocarbon material) is in the form of a horizontally-extending layer that extends into and out of the page relative to the cross-section of FIG. 10A; with the horizontally-extending layer being configured as the liner 32 described above with reference to FIG. 2E.

A pad material 80 is provided over the adhesion-reducing material 33. Such pad material may comprise any suitable composition or combination of compositions, including, for example, one or more of silicon dioxide, silicon nitride, aluminum oxide, titanium nitride, etc. The pad material 80 may be omitted in some embodiments.

A patterned mask 82 is formed over the pad material 80. The patterned mask comprises a masking material 84. The masking material 84 may comprise any suitable composition, and in some embodiments may comprise photolithographically-patterned photoresist. The patterned mask 82 defines locations of openings 14 and 18; and in the shown embodiment has gaps extending therethrough in locations where openings 14 and 18 are to be formed.

Figure 10B:
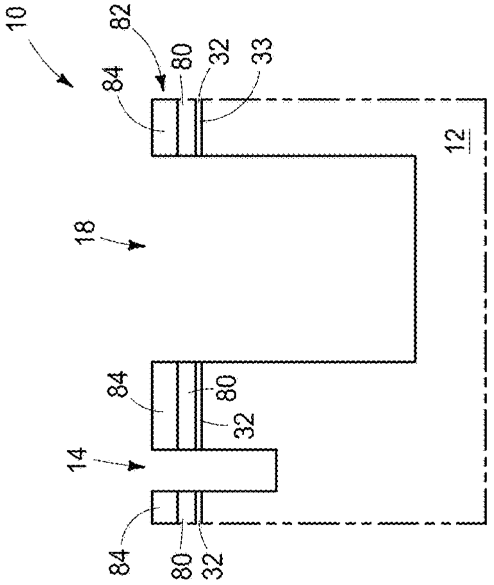

Referring to FIG. 10B, openings 14 and 18 are formed in the locations defined by mask 82 utilizing one or more suitable etches. The openings 14 and 18 extend through the adhesion-reducing material 33 and into the semiconductor substrate 12.

Figure 10C:
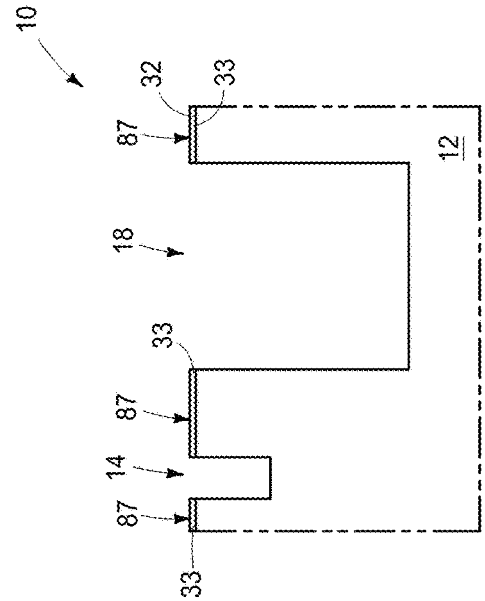

Referring to FIG. 10C, the patterned mask 82 (FIG. 10B) and pad material 80 (FIG. 10B) are removed from over the adhesion-reducing material 33, which leaves an exposed surface 87 of the adhesion-reducing material 33 as an adhesion-reducing surface along regions of the semiconductor substrate 12 between the openings 14 and 18. The adhesion-reducing surface 87 does not extend into the openings 14 and 18. In some embodiments, the adhesion-reducing surface 87 may comprise, consist essentially of, or consist of fluorocarbon; such as, for example, PTFE.

Figure 10D:
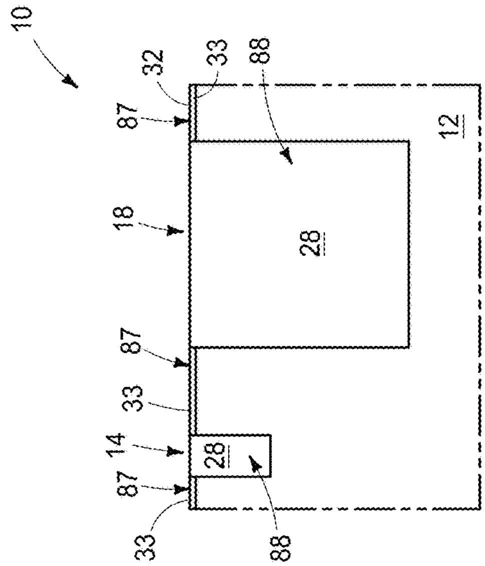

Referring to FIG. 10D, material 28 is formed within the openings 14 and 18. The material 28 may be formed within openings 14 and 18 utilizing any suitable method; including, for example, one or more of the methods described previously herein. The adhesion-reducing surface 87 has a composition to which material 28 does not substantially adhere (e.g., the material 28 may be repelled by the surface 87, or at least may adhere much more poorly to the surface 87 than to other surfaces of the base 12). In some embodiments, the adhesion-reducing surface 87 may be a dewetting surface such that appropriate surface tension is not developed between the adhesion-reducing surface and material 28 for the material 28 to adhere to the surface 87.

In some embodiments, at least some of material 28 is provided on the adhesion-reducing surface 87 during formation of the material 28 within openings 14 and 18. However, material 28 is readily removed from over the adhesion-reducing surface since the material 28 does not substantially adhere to such adhesion-reducing surface.

Figure 10E:
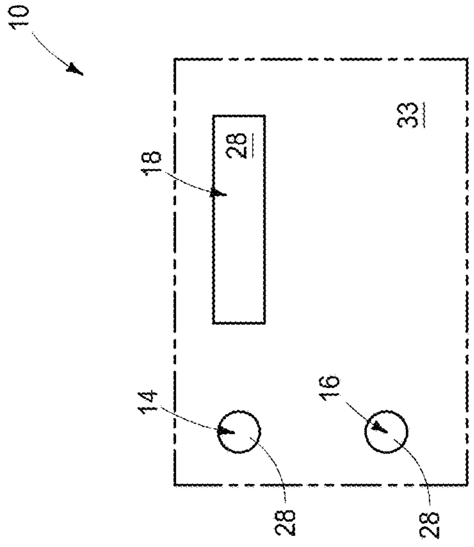
FIG. 10E is a top view of an example semiconductor construction at the processing stage of FIG. 10D.

FIG. 10E shows a top view of the construction of FIG. 10D, and shows the material 33 as a horizontally-extending material which covers the entirety of semiconductor substrate 12 (not visible in FIG. 10E) between the openings 14, 16 and 18.

In some embodiments, the material 28 within openings 14 and 18 at the processing stage of FIG. 10D may be considered to form pillars 88 which extend vertically through the adhesion-reducing material 33 (e.g., through a layer of fluorocarbon material corresponding to adhesion-reducing material 33). The pillars may comprise insulative material (e.g., silicon dioxide) in some embodiments. Alternatively, the pillars may comprise conductive material.

Figure 10F:
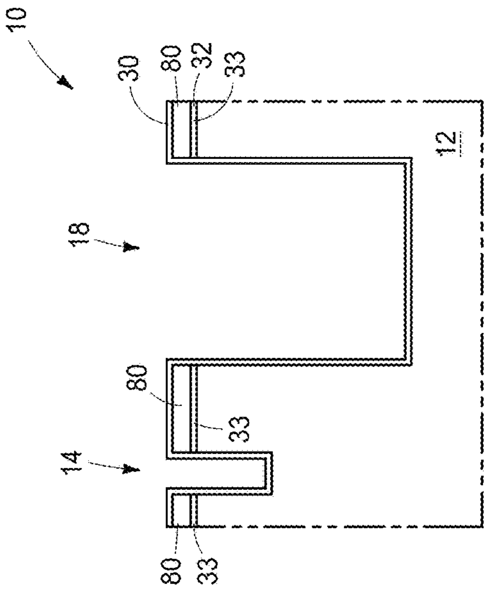
FIGS. 10F-10H are diagrammatic cross-sectional side views of a semiconductor construction at example processing stages that may follow the processing stage of FIG. 10B.

In some embodiments, it may be desired to form the adhesion-promoting liner 30 (FIG. 2E) within openings 14 and 18 prior to the deposition of material 28. FIG. 10F shows construction 10 at a processing stage subsequent to that of FIG. 10B, and after the adhesion-promoting liner 30 is provided within openings 14 and 18, and over pad material 80. The masking material 84 (FIG. 10B) is shown to be removed prior to the processing stage of FIG. 10E, but remain in alternative embodiments.

Figure 10G:
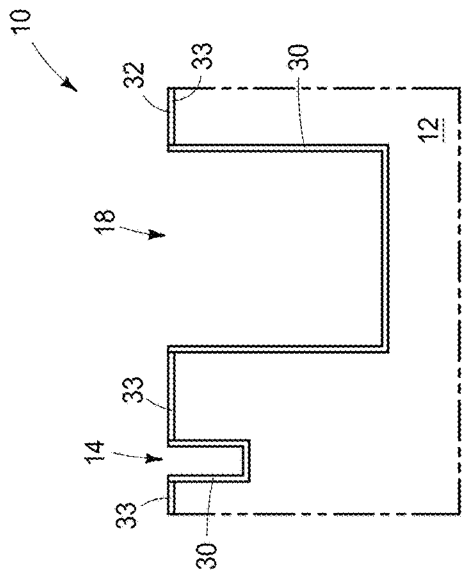

Referring to FIG. 10G, the pad material 80 (FIG. 10E) is removed, together with regions of the adhesion-promoting liner 30 along such pad material. Such removal may be accomplished with any suitable processing. For instance, sacrificial material (not shown) may be provided within openings 14 and 18, CMP maybe utilized to remove the pad material 80, and then the sacrificial material may be removed to leave the construction of FIG. 10F.

Figure 10H:
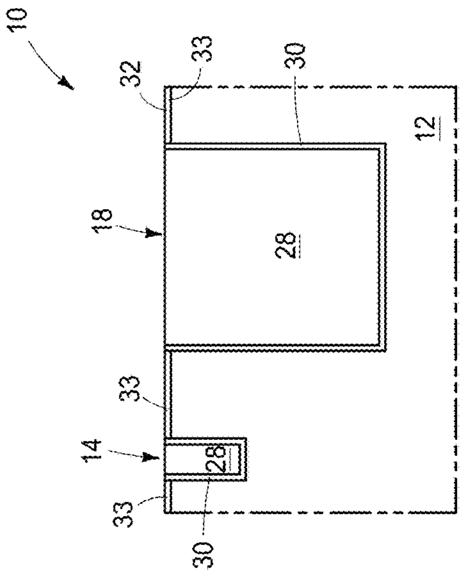

Referring to FIG. 10H, material 28 is provided within openings 14 and 18. The material 28 may be provided within the openings utilizing any suitable method; including, for example, one or more of the methods described previously herein.

Figure 10I:
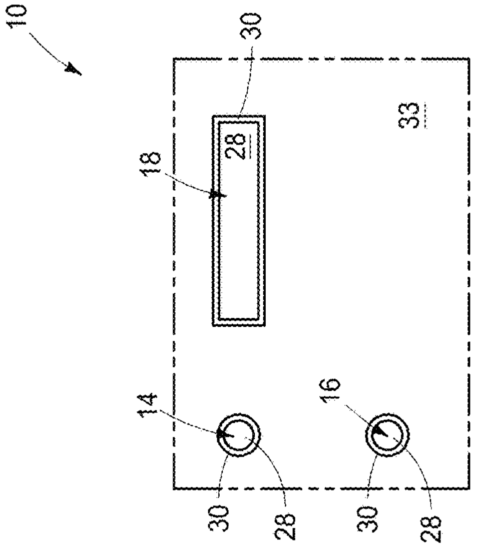
FIG. 10I is a top view of an example semiconductor construction at the processing stage of FIG. 10H.

FIG. 10I shows a top view of the construction of FIG. 10H and shows the material 33 as a horizontally-extending material which covers the entirety of semiconductor substrate 12 (not visible in FIG. 10E) between the openings 14, 16 and 18.

Figure 10J:
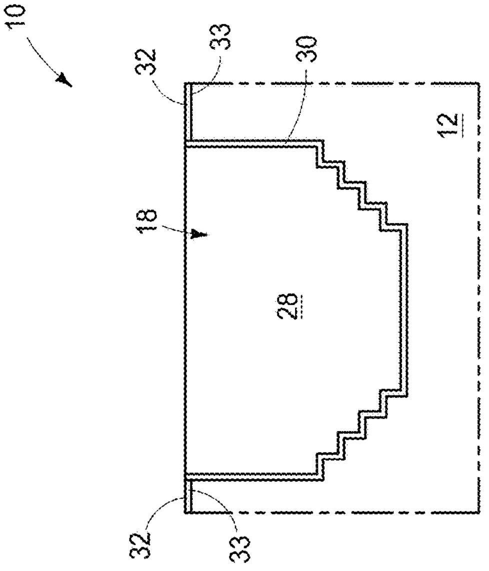
FIG. 10J is a diagrammatic cross-sectional side view of another example semiconductor construction at an example processing stage analogous to that of FIG. 10H.

The openings 14 and 18 are generically shown in the embodiments described above. In some applications, the openings may have specialized configurations. For instance, the large opening 18 may correspond to an opening which extends down to a staircase region adjacent a memory array (for instance, a NAND memory array). The staircase region may have a nonplanar bottom surface, and specifically may have a stadium-type arrangement along the bottom surface, as shown in FIG. 10J. The tiered "steps" at the bottom of opening 10J may be referred to as stair steps in some embodiments. The staircase region may be a region where contacts are formed to individual wordlines extending into the memory array. Difficulties may be encountered in utilizing conventional methods to fill the staircase region with insulative material. However, the embodiments described herein may advantageously enable the large opening associated with the staircase region to be filled with dielectric material, and even to be filled with the dielectric material at a processing stage during which other smaller openings are also filled with the dielectric material.

Figure 11:
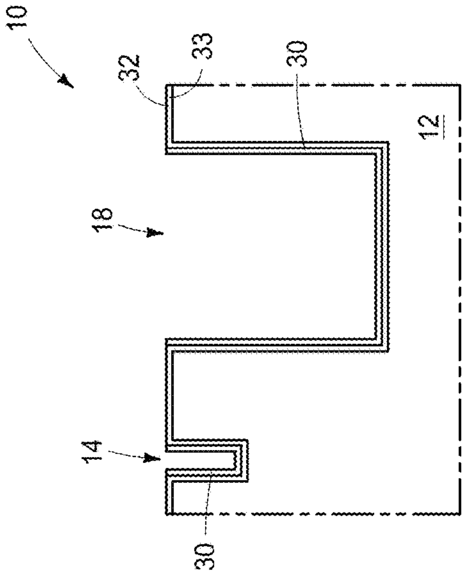
FIG. 11 is a diagrammatic cross-sectional side view of the semiconductor construction of FIG. 1A illustrating another example configuration that may be utilized in processing stages analogous to those of FIGS. 2E, 4F, 5A, 7D and 9E.

In some of the embodiments described above, adhesion-promoting material of liner 30 is formed within openings 14 and 18, and adhesion-reducing material 33 is formed in regions outside of such openings. FIG. 11 shows an analogous embodiment in which the adhesion-reducing material 33 is formed within the openings 14 and 18, and is then covered by the adhesion-promoting liner 30 within the openings. Accordingly, exposed surfaces within openings 14 and 18 are adhesion-promoting surfaces along the adhesion-promoting material of liner 30, and exposed surfaces outside of the openings 14 and 18 are adhesion-reducing surfaces along the adhesion-reducing material 33. The embodiment of FIG. 11 may be acceptable in embodiments in which the adhesion-reducing material 33 can selectively adhere to the adhesion-promoting material of liner 30 and not to material 28. If the adhesion-promoting material of liner 30 does not effectively adhere to the surface of the adhesion-reducing material 33, then it may be more acceptable to utilize one or more of the embodiments described above in which adhesion-reducing material 33 does not extend into the openings 14 and 18 (for instance, the embodiment of FIG. 10H).

It is noted that any of the processes described herein may be utilized in a manner which treats an entire substrate in a single processing step, or in a manner which sequentially treats portions of the substrate one after another (e.g., a stepping mode or scanning mode).

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms “dielectric” and “insulative” may be utilized to describe materials having insulative electrical properties. The terms are considered synonymous in this disclosure. The utilization of the term “dielectric” in some instances, and the term “insulative” (or “electrically insulative”) in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being “on” or “against” another structure, it can be directly on the other structure or intervening structures may also be present. In contrast, when a structure is referred to as being “directly on” or “directly against” another structure, there are no intervening structures present.

Some embodiments include a method of forming material within openings extending into a semiconductor construction. The material is directed into the openings as spray particles from a nozzle. One of openings is of a different size relative to another of the openings. The difference in size is one or both of a difference in area and a difference in depth. Physical characteristics of the spray particles directed into said one of the openings are different than physical properties of the spray particles directed into said other of the openings. The physical properties which are different include one or more of average spray particle size, spray particle density, lateral speed of spray particles relative to a surface of the semiconductor construction, and ionic charge imparted to the spray particles.

Some embodiments include a method of forming material within openings extending into a semiconductor construction. A patterned screening structure is placed onto the semiconductor construction with unblocked regions aligned over the openings and with blocked regions aligned over segments of the semiconductor construction between the openings. A mass of the material is placed onto the patterned screening structure. The material is spread across the patterned screening structure with a bar. The material is pressed through the unblocked regions and into the openings during the spreading of the material. The patterned screening structure is removed together with any excess material over the patterned screening structure, while leaving the material within the openings.

Some embodiments include a method of forming material within openings extending into a semiconductor construction. The material is dispersed over the construction as aerosol drops having average cross-sectional dimensions of less than or equal to about 50 nanometers. The drops filling the openings.

Some embodiments include a method of forming material within openings extending into a semiconductor construction. The material is dispersed over the construction and within the openings. A template is pressed onto a surface of the semiconductor construction to force the material off from regions of the semiconductor construction between the openings, while leaving the material within the openings. The template has headspaces over the openings with depths of at least about 50 nm.

Some embodiments include a method of forming material within openings extending into a semiconductor construction. The material is printed within the openings utilizing a printhead. The material is cured within the openings utilizing a treatment-head joined to the printhead and moving with the printhead.

Some embodiments include a method of forming material within openings extending into a semiconductor construction. An adhesion-reducing surface is formed to be along regions of the semiconductor construction between the openings and to not be within the openings. The material does not substantially adhere to the adhesion-reducing surface. The material is formed over the adhesion-reducing surface and within the openings. The material is removed from over the adhesion-reducing surface while leaving the material within the openings.

Some embodiments include a semiconductor construction having a horizontally-extending layer of fluorocarbon material over a semiconductor construction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming material within openings extending into a semiconductor construction, comprising:

placing a patterned screening structure onto the semiconductor construction; the patterned screening structure having blocked regions and unblocked regions; the unblocked regions comprising a mesh and being aligned over the openings, and additional blocked regions being aligned over segments of the semiconductor construction between the openings;

providing a mass of the material onto the patterned screening structure;

spreading the material across the patterned screening structure with a tool; the material being pressed through the unblocked regions and into the openings during the spreading of the material; and removing the patterned screening structure while leaving the material within the openings; and wherein the patterned screening structure includes a silicate-containing material or a semiconductor material.

2. The method of claim 1 wherein at least one of the openings extends to a staircase region.

3. The method of claim 1 wherein the material is dielectric material.

4. The method of claim 1 wherein the removing of the patterned screening structure while leaving the material within the openings leaves no overfill in the openings.

5. A method of forming material within openings extending into a semiconductor construction, comprising:

placing a patterned screening structure onto the semiconductor construction; the patterned screening structure having blocked regions and unblocked regions; the unblocked regions being aligned over the openings and the blocked regions being aligned over segments of the semiconductor construction between the openings;

providing a mass of the material onto the patterned screening structure;

spreading the material across the patterned screening structure with a tool; the material being pressed through the unblocked regions and into the openings during the spreading of the material;

removing the patterned screening structure while leaving the material within the openings; and wherein the patterned screening structure includes a silicate-containing material.

6. The method of claim 5 wherein the patterned screening structure comprises a mesh.

7. The method of claim 5 wherein the patterned screening structure comprises one of a flexible metal foil, a silicate-containing material or a semiconductor material.

8. The method of claim 5 wherein the removing of the patterned screening structure while leaving the material within the openings leaves no overfill in the openings.

9. The method of claim 5 wherein the patterned screening structure comprises at least one additional composition comprising a flexible metal foil or a polymeric material.

* * * * *